United States Patent [19]
Dalman

[11] Patent Number: 5,262,739
[45] Date of Patent: * Nov. 16, 1993

[54] WAVEGUIDE ADAPTORS

[75] Inventor: G. Conrad Dalman, Ithaca, N.Y.

[73] Assignee: Cornell Research Foundation, Inc., Ithaca, N.Y.

[*] Notice: The portion of the term of this patent subsequent to May 21, 2008 has been disclaimed.

[21] Appl. No.: 969,503

[22] Filed: Oct. 30, 1992

Related U.S. Application Data

[63] Continuation of Ser. No. 801,634, Dec. 4, 1991, abandoned, which is a continuation of Ser. No. 658,203, Feb. 20, 1991, abandoned, which is a continuation of Ser. No. 476,349, Feb. 7, 1990, Pat. No. 5,017,892, which is a continuation-in-part of Ser. No. 352,368, May 16, 1989, abandoned.

[51] Int. Cl.[5] .............................................. H01P 5/107
[52] U.S. Cl. ........................................ 333/26; 333/34
[58] Field of Search .................. 333/21 R, 26, 34, 237

[56] References Cited

U.S. PATENT DOCUMENTS

| | | |
|---|---|---|
| 2,619,539 | 11/1952 | Fano . |
| 2,921,276 | 1/1960 | Fubini . |
| 2,975,380 | 3/1961 | Scharfman . |
| 2,981,904 | 4/1961 | Ajioka et al. . |
| 3,478,282 | 11/1969 | Smith . |
| 3,508,175 | 4/1970 | Alford . |
| 3,539,951 | 11/1970 | Tischer . |
| 3,621,367 | 11/1971 | Rosen et al. ........................ 333/238 |
| 3,882,396 | 5/1975 | Schneider . |
| 3,924,204 | 12/1975 | Fache et al. ...................... 333/26 X |
| 3,932,822 | 1/1976 | Salzberg . |
| 4,122,406 | 10/1978 | Salzberg . |
| 4,126,835 | 11/1978 | Gould . |
| 4,260,964 | 4/1981 | Saul . |
| 4,725,793 | 2/1988 | Igarashi . |
| 4,745,377 | 5/1988 | Stern et al. . |
| 4,801,903 | 1/1989 | Mohr . |
| 5,028,891 | 7/1991 | Lagerlof ............................ 333/26 |

FOREIGN PATENT DOCUMENTS

| | | |
|---|---|---|
| 9348 | 1/1977 | Japan .................................... 333/26 |
| 075249 | 6/1977 | Japan . |
| 87202 | 5/1982 | Japan .................................... 333/26 |
| 046702 | 3/1983 | Japan . |
| 61-142802 | 6/1986 | Japan . |
| 1241316 | 6/1986 | U.S.S.R. . |

OTHER PUBLICATIONS

G. E. Ponchak and R. N. Simons, "A New Rectangular Waveguide to Coplanar Waveguide Transition", 1990 IEEE MIT-S Digest, pp. 491-492, May, 1990.
Mazilu, A Self-Adjusting Waveguide-to-Microstrip Transition, Microwave Journal, Jul. 1987, pp. 133-134.
Schneider et al., *Microwave and Millimeter Wave Hybrid Integrated Circuits for Radio Systems*, The Bell System Tech. Journal, Jul.-Aug. 1969, pp. 1703-1726.
Izadian, *Testing Transistors at Millimeter Waves for Noise Parameters*, Microwaves & RF, Oct. 1987, pp. 71-80.
Izadian, Unified Design Plans and Waveguide Transitions, Microwaves & RF, May 1987, pp. 213-222.

*Primary Examiner*—Paul Gensler
*Attorney, Agent, or Firm*—Jones, Tullar & Cooper

[57] ABSTRACT

A waveguide adaptor or transition for interfacing a microwave waveguide to a coplanar transmission line or electronic device is disclosed. The adaptor includes a waveguide section having an integral coplanar transmission line formed in a longitudinal slot in a top wall thereof. A metallic fin is disposed in the waveguide which extends into the slot. The transmission line is coplanar because the edges of the slot on either side of the fin both act as ground planes. A tapered portion of the fin gradually rises from the bottom surface of the waveguide into the slot which acts as an impedance matching structure between the waveguide and the transmission line. Numerous circuit elements can be connected to the transmission line so that the adaptor can be used to fabricate oscillators, amplifiers, filters and other devices. In particular, a Gunn oscillator formed with the adaptor is disclosed. In another embodiment, the fin is made out of insulating material having conductive patterns disposed on both sides to form a conventional waveguide to coplanar waveguide transition.

11 Claims, 10 Drawing Sheets

WAVEGUIDE ADAPTORS

This application is a continuation of application Ser. No. 07/801,634, filed Dec. 4, 1991, now abandoned, which is a continuation of application Ser. No. 07/658,203, filed Feb. 20, 1991, now abandoned, which is a continuation of application Ser. No. 07/476,349, filed Feb. 7, 1990, now U.S. Pat. No. 5,017,892, which is a continuation-in-part of application Ser. No. 07/352,368, filed May 15, 1989, now abandoned.

The present invention relates, in general, to a microwave waveguide to coplanar transmission line adaptor.

Microwaves can be transmitted through a number of different types of transmission media, including waveguides, microstrip transmission lines and coaxial cables. Often times, it is necessary to interface one type of transmission medium with another. Various types of transitions or adaptors have been employed for this purpose which comprise impedance matching structures for interfacing the two types of transmission media to insure that the electric and magnetic field lines of the microwave will match at the interface.

Examples of such impedance matching structures include fins, ridges and steps, that are disposed in a waveguide, and guide microwaves into an interface, which can be with a microstrip transmission line, for example. The ridges, fins and steps are physically designed to transform the impedance of the waveguide to match that of the microstrip transmission line. For example, to match the waveguide impedance to a 50 ohm microstrip, a ridge can be used whose thickness and height is tapered, the actual impedance transition involves the transition from the normally high impedance of the waveguide (on the order of a few hundred ohms) where the ridge height is zero, to the lower 50 ohm impedance of the microstrip where the ridge contacts the microstrip.

To date, microwave transition and adaptor structures have been fairly complicated and costly due to the interfacing and impedance matching requirements. Also, no efficient, broad band adaptors are known which can interface a waveguide to a structure having more than one ground plane. The present invention seeks to provide an adaptor structure which solves these problems.

SUMMARY OF THE INVENTION

It is therefore the object of the present invention to provide waveguide to coplanar transmission line adaptors which are easy to fabricate, inexpensive and can provide low reflection, broad band interfaces between waveguides and various types of circuits or devices.

It is a further object of the present invention to provide waveguide to coplanar transmission line adaptors that provide two ground planes so that they may be employed with coplanar circuits.

These and other objects of the invention are achieved by providing waveguide to coplanar transmission line adaptors in which a top wall of the waveguide is made an integral part of the transmission line. This is accomplished by forming a longitudinal slot in the center of the top wall of the waveguide, and providing a tapered fin on the bottom floor of the waveguide which gradually slopes upward into the slot. The fin acts to guide microwaves from the waveguide into the slot, which thereby becomes a part of the transmission line.

The two edges of the slot on either side of the fin both act as ground planes for the transmission line so that it can be employed with coplanar circuits including active elements, oscillators, filters, resonators, etc. In a first embodiment, a carrier block is disposed on top of the waveguide in contact with the waveguide transmission line. The carrier block houses active circuitry to be connected to the waveguide, and includes conductive patterns formed on the bottom surface thereof which serve to guide microwaves from the waveguide transmission line to the active circuitry.

In another embodiment, the waveguide transmission line terminates at a negative resistance diode holder to form a Gunn oscillator. The fin and slot in this embodiment act as a capacitance coupled resonator which, in conjunction with a capacitive gap cut in the fin, forms a resonant circuit for the oscillator. Alternatively, a stub tuned resonator section is formed using a matching stub structure on the fin to act as part of the resonant circuit of the oscillator.

In yet another embodiment of the invention, conductive metallizations are formed on both sides of a dielectric fin disposed longitudinally in a waveguide. These metallizations are patterned to form a transition between a conventional waveguide and a coplanar waveguide. The transition includes three distinct portions. A first portion employs antipodal fin lines to guide waves from the waveguide to a second portion forming a microstrip transmission line, which in turn guides the waves to a third portion that forms the coplanar waveguide.

BRIEF DESCRIPTION OF THE DRAWINGS

The objects, features and advantages of the present invention will become apparent from a consideration of the following detailed description of preferred embodiments thereof, taken in conjunction with the accompanying drawings, in which.

DETAILED DESCRIPTION OF THE PREFERRED EMBODIMENTS

Figure 1:
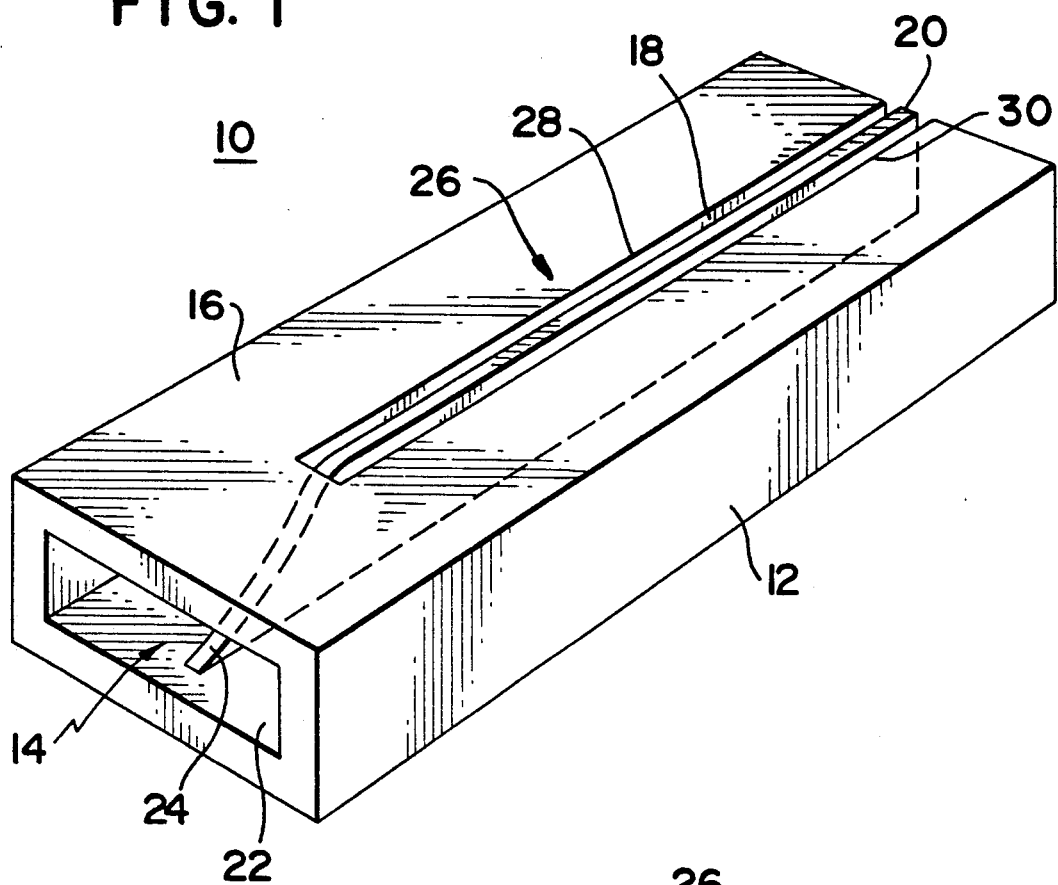
FIG. 1 is a perspective illustration of a waveguide adaptor that forms a first embodiment of the present invention, showing an impedance matching fin in phantom.

Turning now to a more detailed consideration of the present invention, there is illustrated in FIG. 1, a waveguide adaptor 10 which includes a hollow rectangular waveguide 12 having a port 14 for reception of microwave signals. A top wall 16 of waveguide 12 has a centrally disposed longitudinal slot 18 cut therein that extends over most of the length of waveguide 12. A metallic fin 20 is vertically disposed on an inner floor 22 of waveguide 12 which projects through, and runs parallel to, slot 18. Fin 20 includes a tapered portion 24 which gradually runs down to floor 22.

Fin 20 and slot 18 combine to form an integral transmission line 26 along the top surface 16 of waveguide 12. This transmission line is essentially a modified coplanar waveguide with limited width ground planes. A pair of edges 28 and 30 of slot 18 form two different ground planes for transmission line 26.

In the operation of waveguide adaptor 10, a microwave signal entering port 14 will encounter tapered portion 24 of fin 20, and be guided gradually upward until it reaches transmission line 26. Typical operation of transmission line 26 would be in the odd-mode in which the electric fields in each half of the line are directed toward fin 20.

Figure 2A:
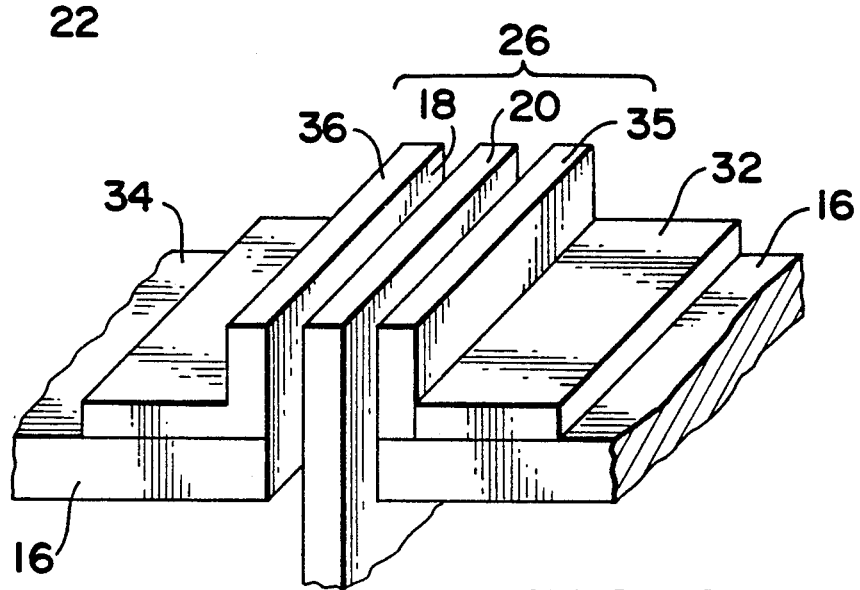
FIG. 2A–2C are partial perspective view of alternative lo embodiments of transmission line structures formed in the top wall of a waveguide.
Figure 2B:
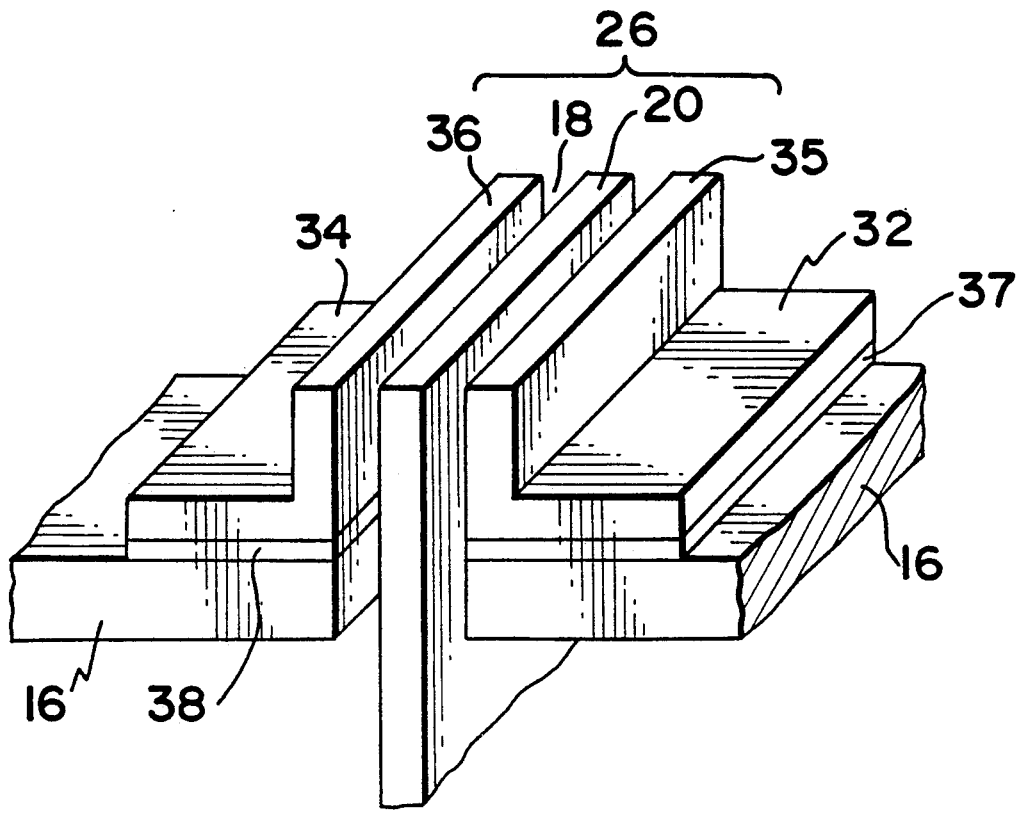
Figure 2C:
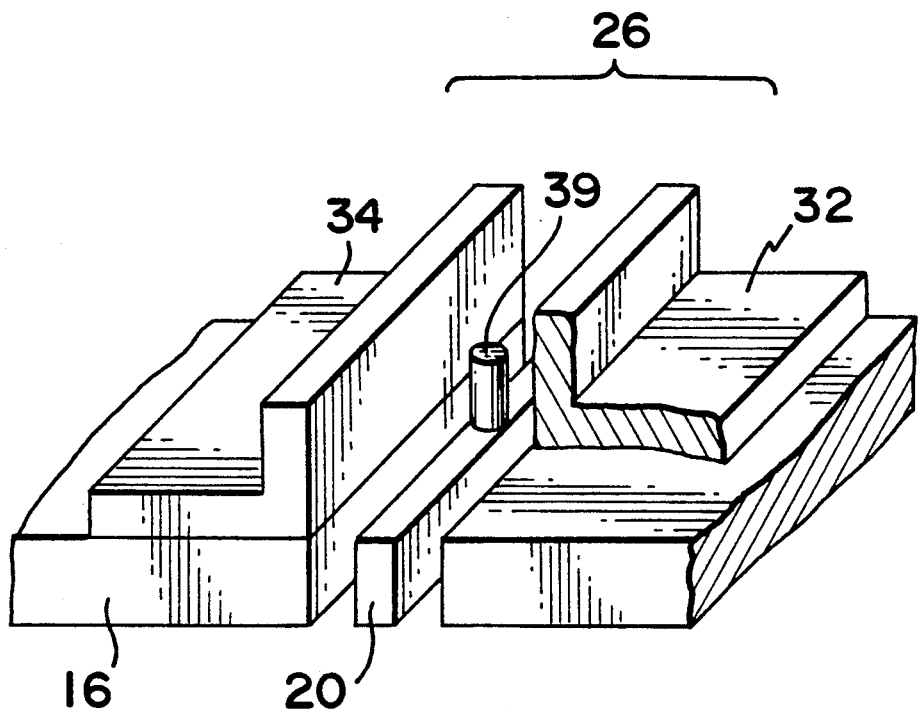

A modification to the adaptor structure of FIG. 1 is illustrated in FIG. 2A. In this modification, fin 20 extends through slot 18, and projects above top wall 16. A pair of L-shaped extensions 32 and 34 are disposed on either side of slot 18 which have top edges 35 and 36, respectively, that are positioned at the same height as, and run parallel to, the top of fin 20. The effect of this structure is to extend the width of the formed transmission line 26 to lower its characteristic impedance. The effect of the interface between extensions 32 and 34 and top wall 16 is negligible since the transmission line currents flow along the interface. If desired, as shown in FIG. 2B, a pair of insulation layers 37 and 38 can be disposed between top wall 16 and extensions 32 and 34, respectively. These layers enable a bias voltage to be applied to extensions 32 and 34 if desired. If further desired, a shunt matching stub 39 can be disposed on the top of the fin 20, which is shortened as illustrated in FIG. 2C. This structure makes it possible to make fine adjustments to the overall performance characteristics of the waveguide adaptor 10.

Figure 3A:
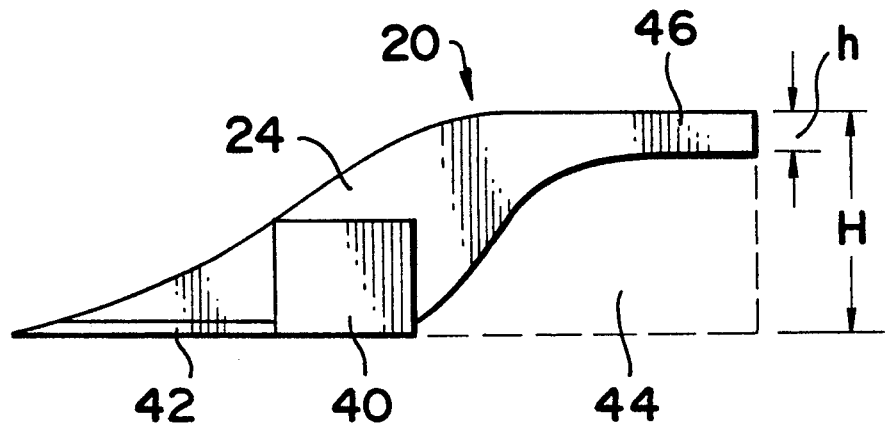
FIGS. 3A and 3B are side and front elevational views, respectively, of an impedance matching fin that forms a part of the waveguide adaptor of the present invention.
Figure 3B:
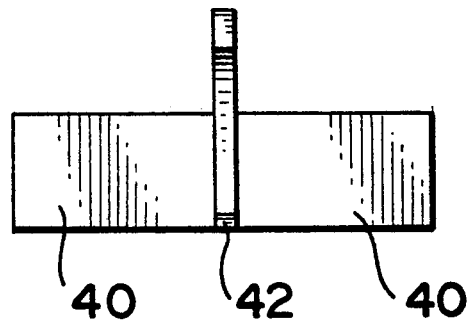
Figure 3C:
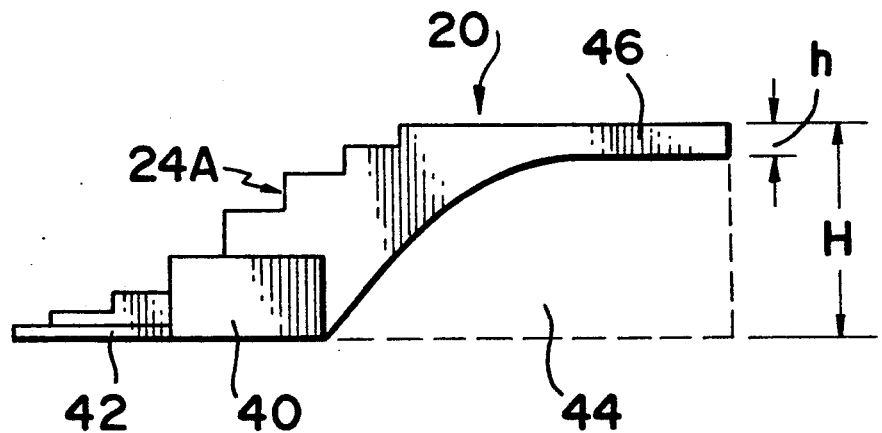
FIG. 3C is a side elevational view of an alternative fin construction.

Turning now to FIGS. 3A-C, details of the construction of fin 20 are illustrated. In particular, in FIGS. 3A and 3B, a support block 40, which may be formed from any suitable low dielectric constant material such as styrofoam, is shown surrounding a portion of fin 20 so that the fin will stand erect in a waveguide without the need for a direct mechanical connection between the fin and the waveguide. This enables an insulation layer 42 to be disposed on the bottom of fin 20 so that it will be electrically insulated from the waveguide. When assembled in this manner, it is possible to bias electronic devices which are connected across the transmission line formed by the fin 20. Alternatively, fin 20 can be soldered or bolted directly to the bottom of the waveguide, thereby eliminating the need for the support block 40, although this arrangement would electrically connect fin 20 to the waveguide.

The tapered portion 24 of the top of fin 20 must be gradual so as to minimize reflections, and by way of example is illustrated as being a half wave section of a cosine wave. An alternative configuration is illustrated in FIG. 3C, which, illustrates the fin 20 as having a stepped tapered portion 24A. This forms a seven step Chebyshev quarter wave transformer.

Both of the fins illustrated in FIGS. 3A-C are shown as having a cut out portion 44 that forms a free end 46 having a thickness h, where h is less than or equal to the total height H of fin 20. The dashed lines in FIGS. 3A and 3C illustrate the case where there is no cut out portion 44, and h=H. By making the thickness h of free end 46 equal to the thickness of the top wall of the waveguide (and therefore equal to the thickness of the ground planes), the transmission line can be made to behave much like a conventional modified coplanar waveguide. This may be desirable in some applications, and it will be understood that the particular configuration of fin 20 can be selected as desired.

Figure 4:
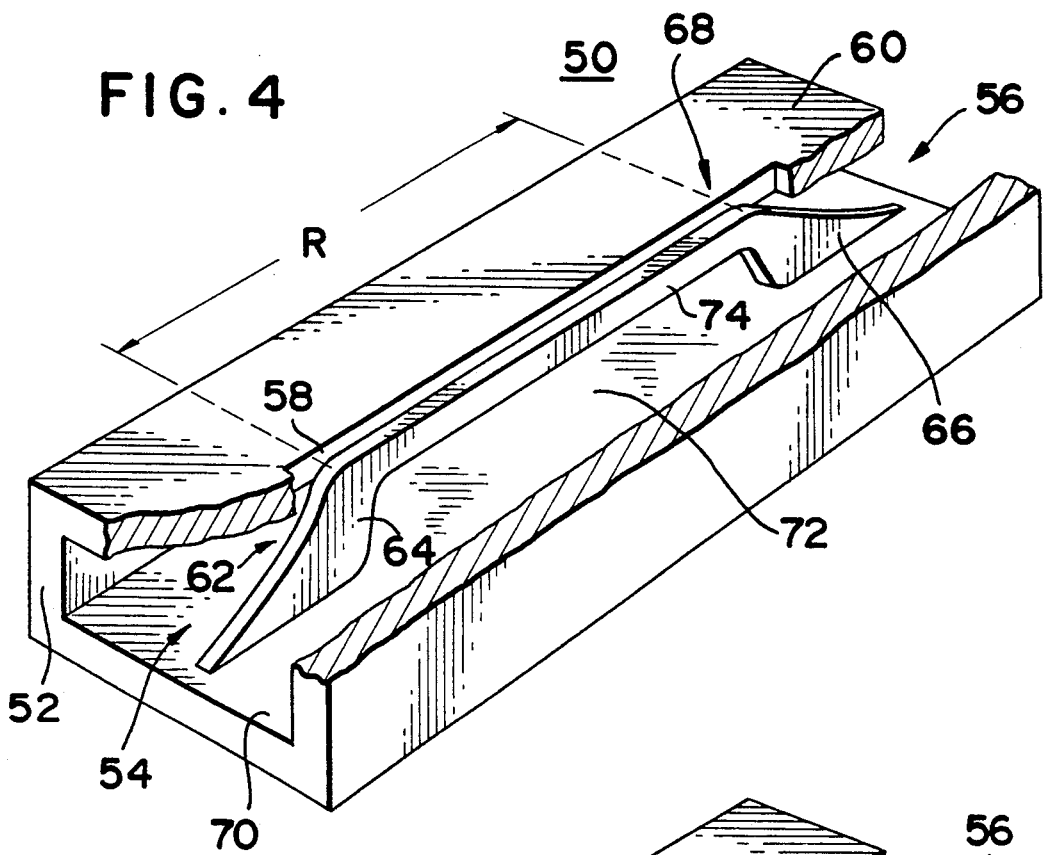
FIG. 4 is a cutaway perspective illustration of a through-section two port waveguide adaptor.

Turning now to FIG. 4, a two port waveguide adaptor 50 is illustrated which includes a hollow rectangular waveguide 52 having first and second signal ports 54 and 56. As in the embodiment illustrated in FIG. 1, a centrally disposed longitudinal slot 58 is formed in a top wall 60 of waveguide 52 through which protrudes, a vertically disposed fin 62. Fin 62 includes a pair of tapered portions 64 and 66 which are disposed at either end of fin 62 near signal ports 54 and 56, respectively. These tapered portions serve to guide signals entering either port of the waveguide to a transmission line 68 formed in the top wall 60 of waveguide 52 by slot 58 and fin 62. Although fin 62 is illustrated as being directly attached to a floor 70 of waveguide 52, it will be understood that fin 62 could be mounted in an insulated manner using the arrangement of FIGS. 3A-C. In addition, fin 62 is illustrated as having a cut out portion 72 like that of the fin illustrated in FIG. 3A. Cut out portion 72 forms a bridge portion 74 of fin 62 which, in conjunction with slot 58, forms a region of constant characteristic impedance R of transmission line 68. Again, because the thickness of bridge portion 74 is approximately equal to that of top wall 60, transmission line 68 behaves like a modified coplanar waveguide. Dielectric sheets can be inserted into slot 58 on both sides of fin 62 within the region R, if desired. If the dielectric is loss-free, adaptor 50 can be used as a broadband adjustable phase shifter. If the dielectric is lossy, adaptor 50 can be used as an attenuator.

Figure 5A:
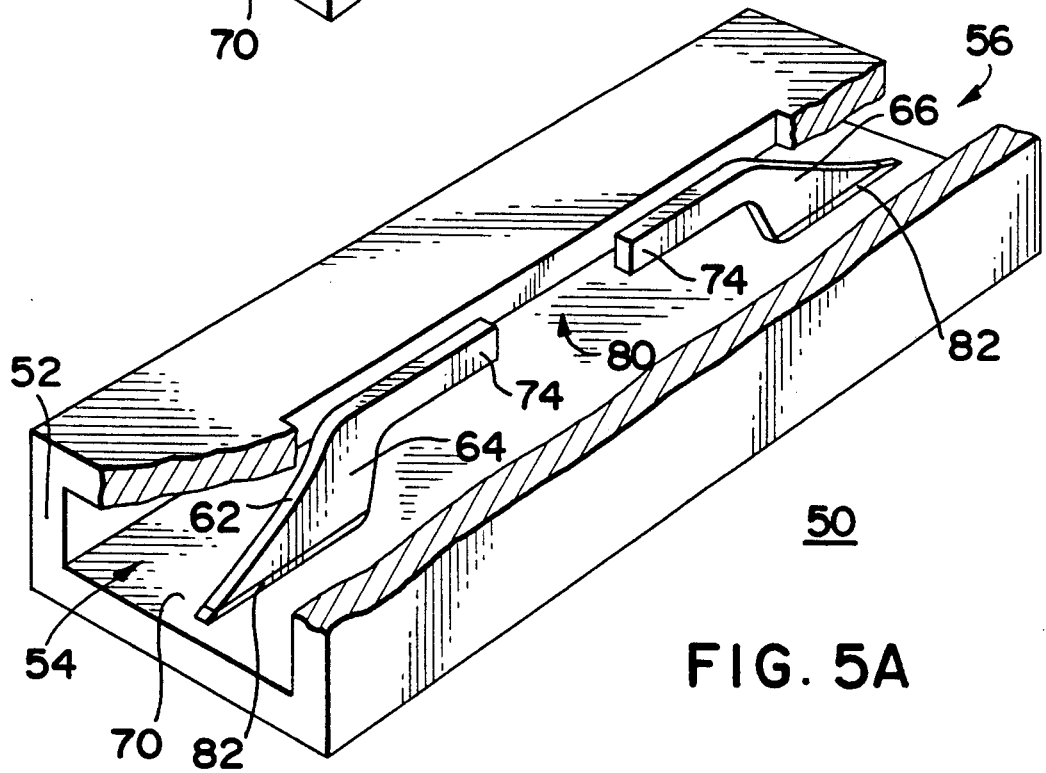
FIGS. 5A and 5B are cutaway perspective illustrations of two port waveguide adaptors having a two part fin construction.

Fin 62 can also be modified to accommodate a transistor, amplifier, or other circuit module as illustrated in FIG. 5A. As shown, fin 62 can be split into two sections, including tapered portions 64 and 66, by removing a part of bridge portion 74. This forms a short air gap 80 between portions 64 and 66. An insulation layer 82 can be disposed between the floor 70 of waveguide 52 and fin 62 so that voltages can be applied to the tapered sections 64 and 66 to bias the transistor or amplifier module.

Figure 5B:
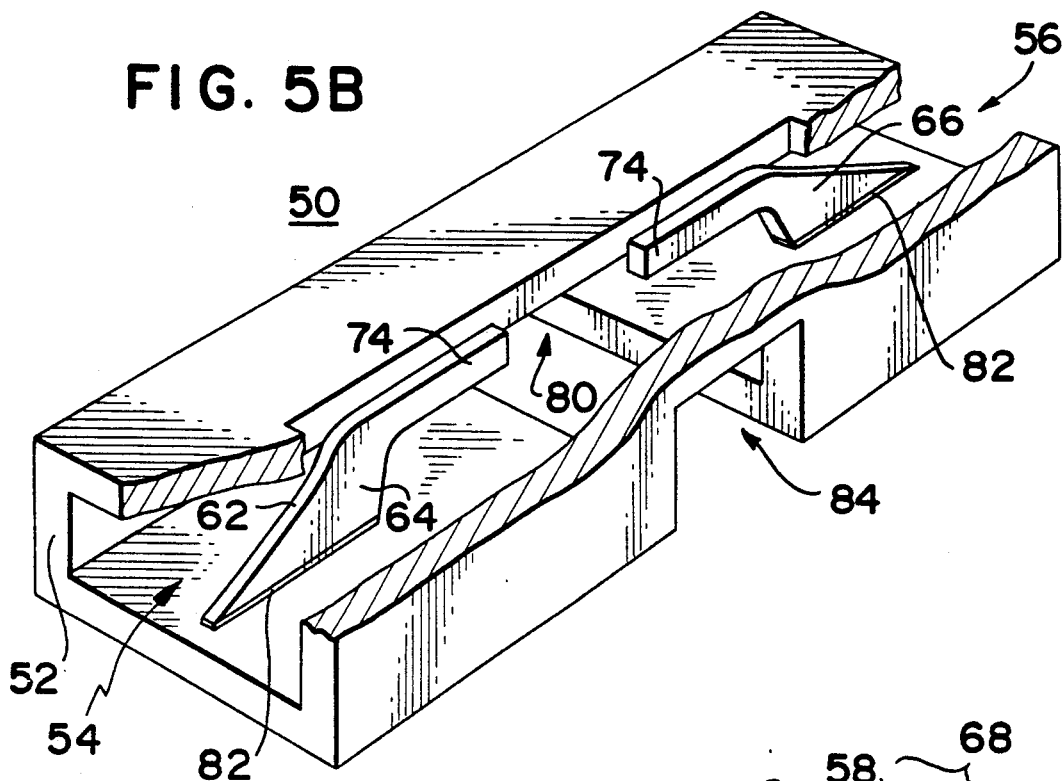

A further modification to the waveguide adaptor 50 is illustrated in FIG. 5B. This embodiment is similar to that illustrated in FIG. 5A, however, a lateral slot 84 is cut in the lower portion of the waveguide 52 to prevent interaction of discontinuities between the ports 54 and 56. Without the lateral slot 84, undesirable resonance effects in the frequency characteristics of the adaptor 50 can occur due to imperfections in the taper, positioning and symmetry of the fin portions 64 and 66 at the ports 54 and 56. The lateral slot 84 substantially reduces or eliminates these effects.

Figure 6:
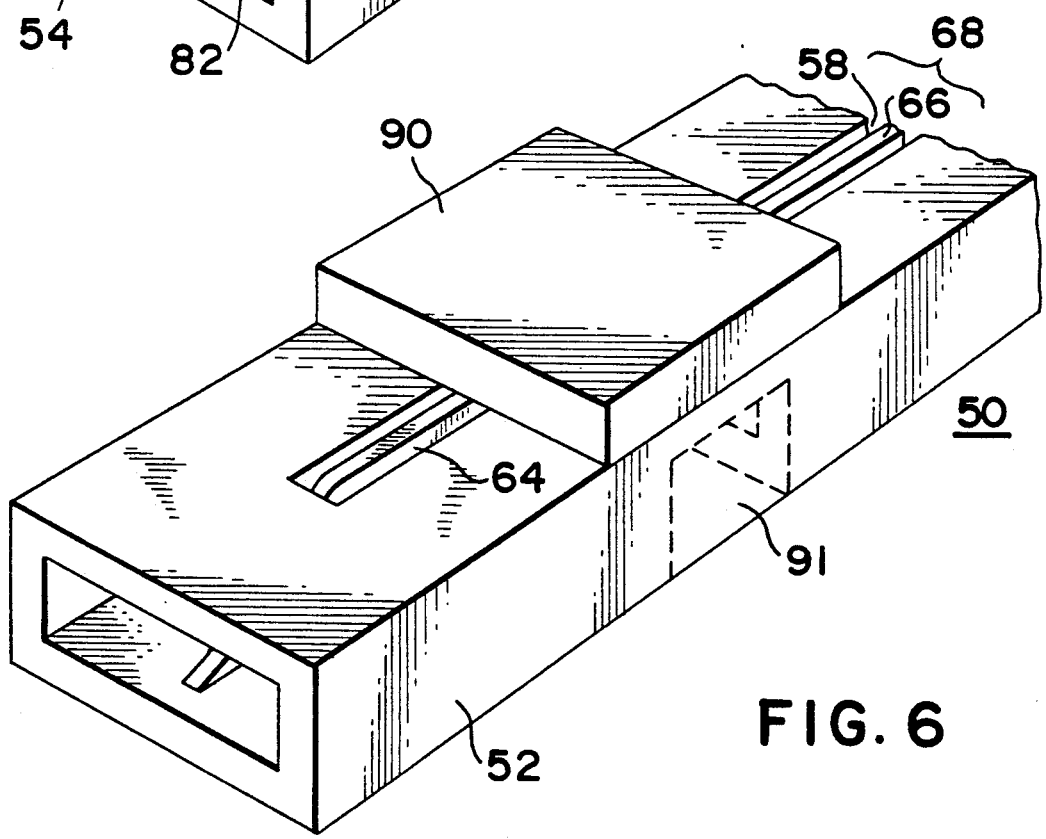
FIG. 6 is a perspective illustration of a waveguide adaptor having a carrier block for a through connection circuit element attached thereto.

As illustrated in FIG. 6, a carrier block 90 which contains the circuit module is placed over the adaptor 50 so that mechanical and electrical contact is made between the transmission line 68 and the block 90. It can be held in place by any suitable means such as clamps, solder or other adhesive. As illustrated by the dashed lines, a lateral slot 91 can also be cut in the waveguide 52 in this embodiment for the same reasons give above in the discussion of FIG. 5B. It should also be noted that the shunt matching structure of FIG. 2C can be incorporated close to the carrier block 90 at the input end, output end or both. This structure makes it possible to make final adjustments to the overall performance characteristics of the carrier block 90 if needed.

Figure 7:
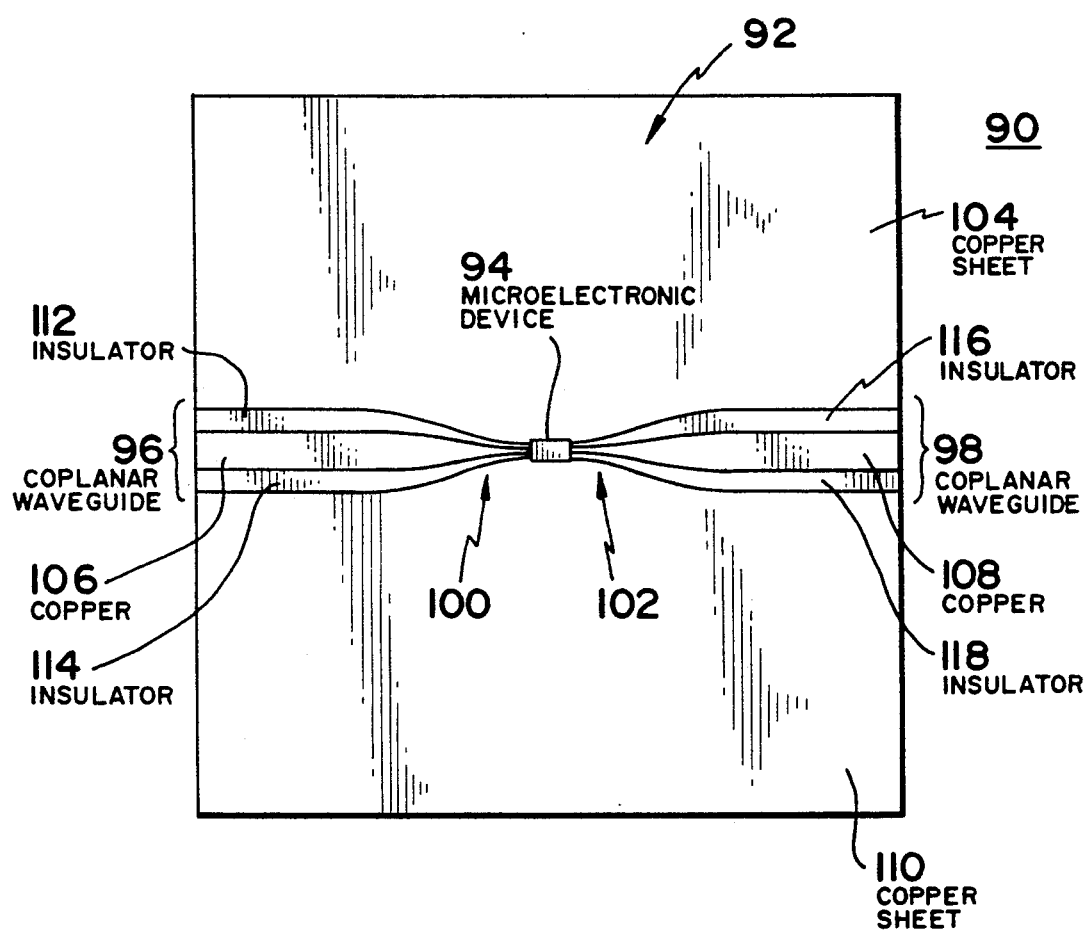
FIG. 7 is a bottom view of a first embodiment of the carrier block of FIG. 6.

An example of an underside 92 of carrier block 90 is illustrated in FIG. 7. As shown, a microelectronic device 94, such as transistor and its associated circuits, is centrally disposed on underside 92. First and second coplanar waveguides or transmission lines 96 and 98 extend from opposite sides of device 94. These waveguides include tapered portions 100 and 102 which taper at a constant impedance to microelectronic device 94.

Coplanar waveguides 96 and 98 are formed on underside 92 by a large upper copper sheet 104; a pair of narrow copper strips 106 and 108 which radiate from opposite sides of microelectronic device 94; and, a large lower copper sheet 110, all of which are separated from one another by a plurality of insulator strips 112-118. When carrier block 90 is positioned on adaptor 50 as illustrated in FIG. 6, copper strips 106 and 108 will contact the biased tapered portions 64 and 66 of fin 62 illustrated in FIG. 5, while large copper sheets 104 and 100 will contact the two ground planes (edges of slot 58) of transmission line 68. By this means, a very small electronic device having a coplanar structure can be coupled over a broad frequency range to a waveguide input and output circuit. In the embodiment of FIGS. 6 and 7, fin 62 penetrates top wall 60 of waveguide 52, and incorporates the circuit formed on carrier block 90 as an important part of the impedance matching circuit.

For some cases, a transition between a coplanar transmission line and a microstrip transmission line is needed in the carrier block. An arrangement for achieving this is illustrated in FIGS. 8A-D, which illustrate a coplanar to microstrip transition 120 that includes an insulating substrate 121 which is incorporated into the bottom of another embodiment of the carrier block 90 of FIG. 6. Referring to FIG. 8A, substrate 121 includes a bottom side 122 which has disposed thereon, a central conductive strip 124 that runs the length thereof. A pair of outer conductive strips 126 and 128 are disposed on substrate 120 that run parallel to central strip 124 about two thirds of the way down its length, and then include a pair of tapered portions 130 and 132 that fan out gradually to the edges of substrate 120.

Transition 120 is incorporated into carrier block 90 so that central conductive strip 124 will contact fin 62, and outer conductive strips 126 and 128 will contact the edges of slot 58, when carrier block 90 is positioned on the waveguide as illustrated in FIG. 6.

Figure 8C:
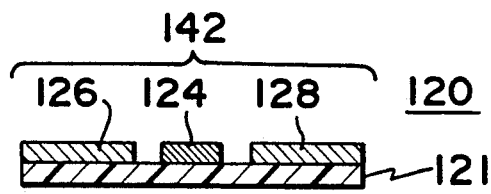
FIGS. 8A–D are a bottom view, a top view and cross sectional views along lines 1—1 and 2—2, respectively, of a coplanar to microstrip transition for use with a second embodiment of the carrier block of FIG. 6.
Figure 8A:
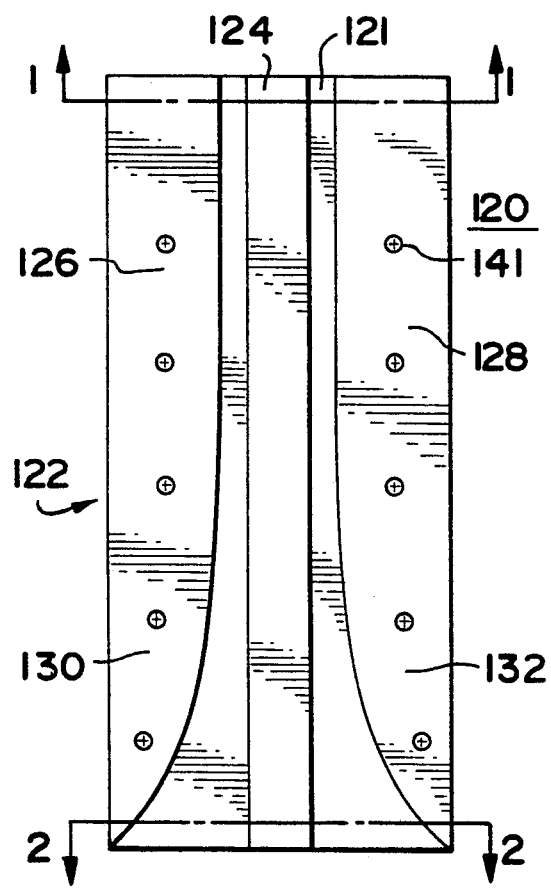
Figure 8B:
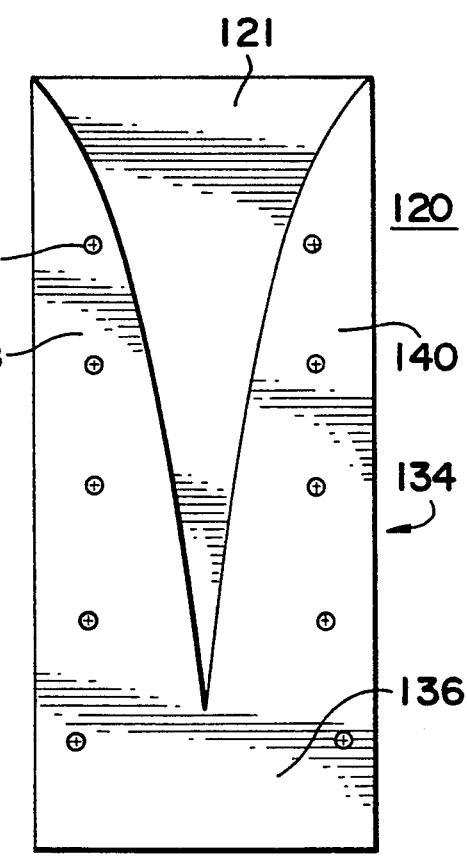

Disposed on a top side 134 of substrate 121 as illustrated in FIG. 8B, is a conductive layer 136 that includes two tapered leg portions 138 and 140 that fan out toward the top corners of substrate 121, but merge together near the bottom end of substrate 121 so that the top side 134 is completely covered by conductive layer 136 at that point. A plurality of conductive rivets 141 serve to electrically connect conductive strips 126 and 128 on the bottom side of substrate 121, to conductive layer 136 on the top side of substrate 121.

Figure 8D:
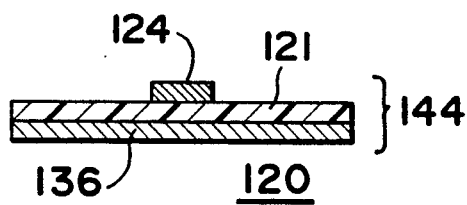

The cross section of the top end of transition 120 is illustrated in FIG. 8C. Conductive strips 124, 126, and 128 form a coplanar transmission line 142 at this point. The cross section of the bottom end of transition 120 is illustrated in FIG. 8D, where conductive strip 124 on the bottom side of substrate 120, and conductive layer 136 on the top side of substrate 120, combine to form a microstrip transmission line 144.

Figure 9A:
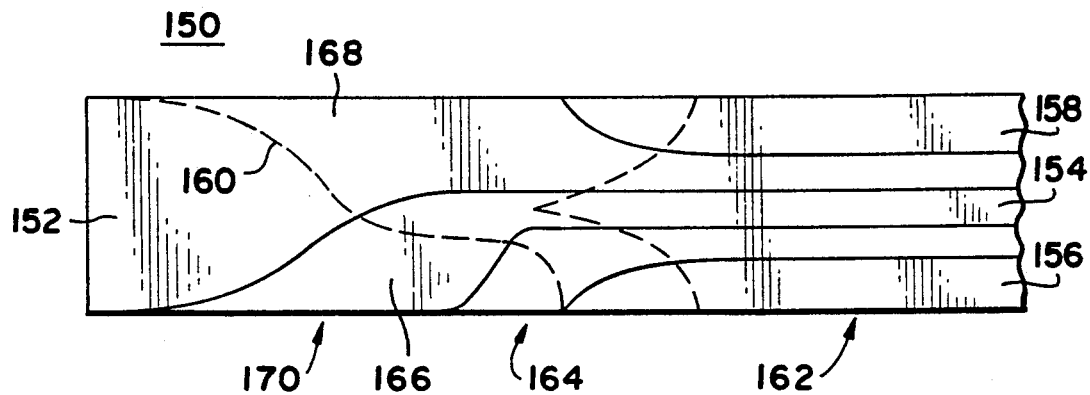
FIG. 9A is a front side view of another type of transition for interfacing a conventional waveguide to a coplanar waveguide, with a metallization pattern on the back side being shown in phantom.

Turning now to FIG. 9A, another transition 150 is shown which provides a broad band transition from a conventional waveguide to a coplanar waveguide. It is formed from an insulating substrate 152 having a plurality of front side metallization areas 154-158 and a backside metallization area 160 disposed thereon. Front side metallizations 154-158 form a coplanar waveguide 162 on the right side of substrate 152, which transforms into a microstrip transmission line 164 near the middle of the substrate formed from front side metallization 154 and back side metallization 160. These two metallizations then taper off to the left side of substrate 162 in the form of two antipodal fin lines 166 and 168 which form a fin line transition 170.

Figure 9B:
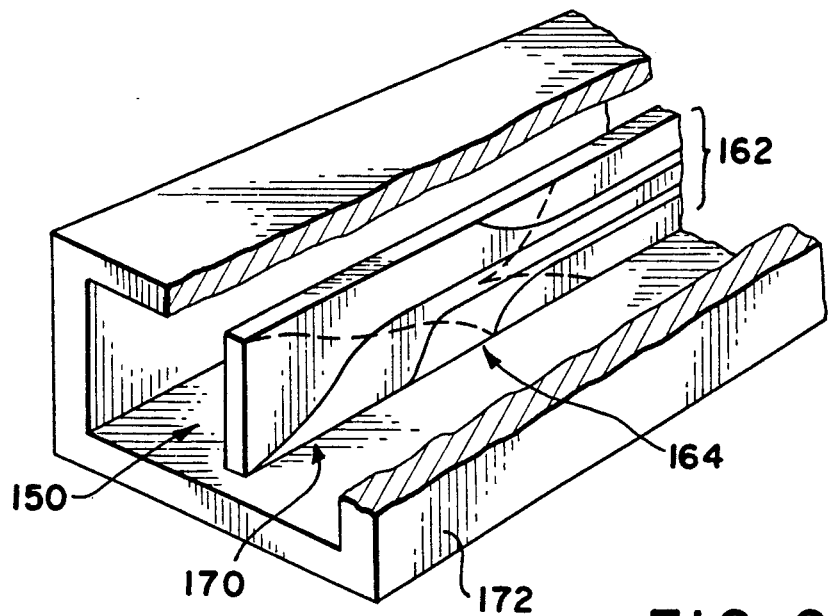
FIG. 9B is a cutaway perspective view of a waveguide having the transition of FIG. 9A disposed therein, with the metallization on the back side of the transition being shown in phantom.

Turning to FIG. 9B, when transition 150 is disposed vertically in the center of a rectangular waveguide 172, fin line transition 170 acts to guide waves from waveguide 172 to microstrip transmission line 164, and finally to coplanar waveguide 162.

Figure 10A:
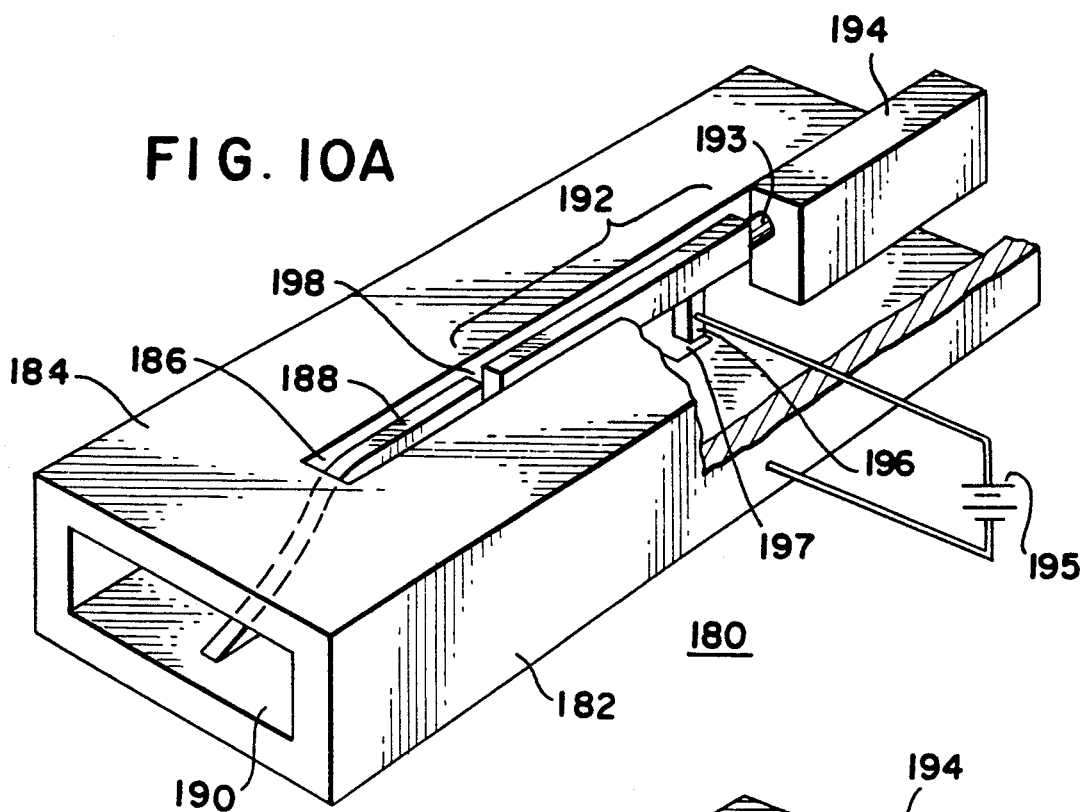
FIGS. 10A and 10B are cutaway perspective views of negative resistance oscillators constructed with the waveguide adaptor of the present invention; and, FIGS. 11A and 11B are cutaway perspective views of two alternative embodiments of a waveguide to coaxial line adaptor.

The integral transmission line formed in the top wall of the various adaptors can also be used to provide filters, oscillators, etc. For example, in FIG. 10A, an adaptor 180 is shown which forms a Gunn oscillator. Adaptor 180 is similar in construction to the adaptor illustrated in FIG. 1, and includes a hollow rectangular waveguide 182 having a top wall 184 with a centrally disposed longitudinal slot 186 formed therein. A vertically disposed tapered metallic fin 188 is affixed to an inner floor 190 of waveguide 182, and protrudes into slot 186 to form a capacitance coupled resonator section 192 therewith. A Gunn-effect (negative resistance) diode 193 is disposed between the far end of resonator 192 and a metal heat sink block 194 in the far end of slot 186. A battery 195 is connected between diode 193 and waveguide 182 to provide voltage to the diode. The positive terminal of battery 195 is connected to a center conductor support 196 of resonator 192, which in turn is connected to diode 193; while the negative terminal of battery 195 is connected to waveguide 182. A r-f bypass insulator 197 is disposed between the base of center conductor support 196 and the floor 190 of waveguide 182.

Resonator 192, in conjunction with a capacitive gap 198 in fin 188, forms a resonant circuit for the oscillator. It can be tuned over a range of frequencies (e.g. 100-1000 MHz) by partially or completely inserting sheets of dielectric material into slot 186 on either side of fin 188. This structure is ideally suited to higher frequency oscillators (up to 100 GHz) since the absence of dielectric media in the resonator formed by transmission line 192 eliminates dielectric losses. It also makes the structure larger than the other types fabricated on dielectric substrates.

Figure 10B:
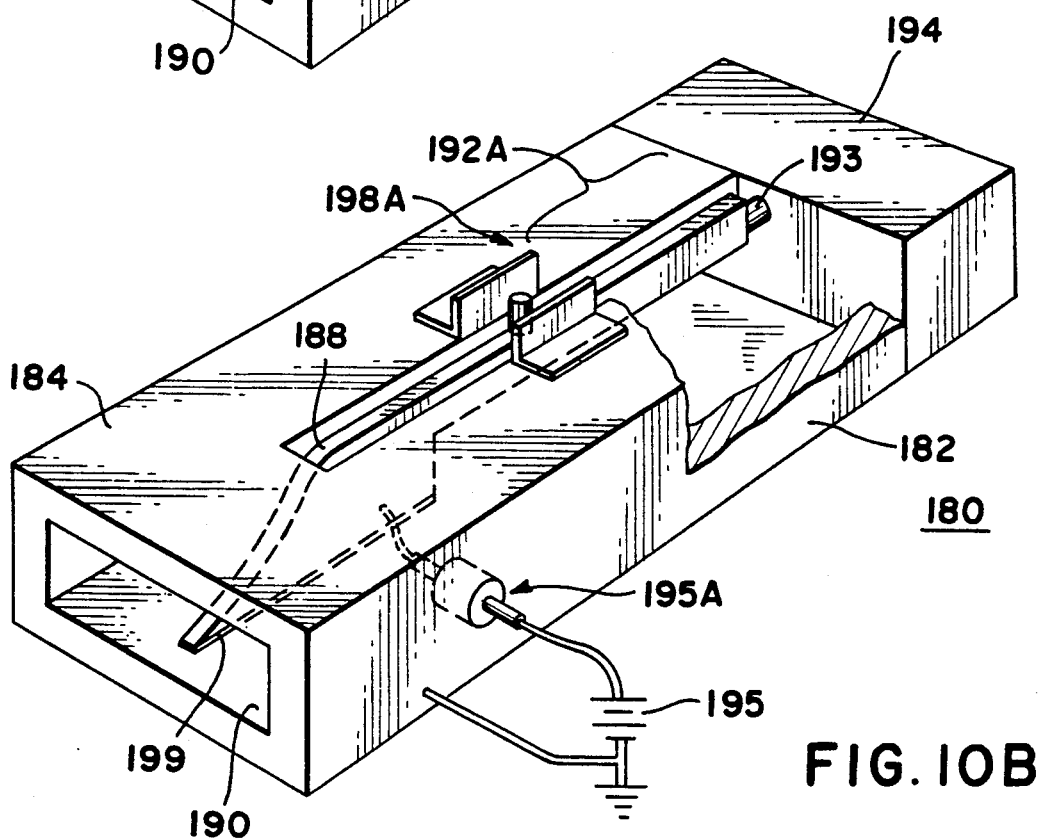

FIG. 10B shows another embodiment of a Gunn oscillator 180 in which the capacitance-coupled resonator section 192 is replaced with a stub tuned resonator section 192A using the matching stub structure of FIG. 2C. In particular, a matching stub structure 198A replaces the capacitive gap 198 in the fin 188, and the fin 188 is insulated from the waveguide 182 by an insulator layer 199. The positive terminal of the battery 195 is then connected through a voltage feed through structure 195A in the sidewall of the waveguide 182 to the fin 188, which in turn is connected to the diode 193. Also, the heat sink block 194 forms a cap on the far end of the waveguide 182 in this embodiment. As With the embodiment of FIG. 10A, resonator 192, in conjunction with the matching stub 198A, forms a resonant circuit for the oscillator.

Figure 11A:
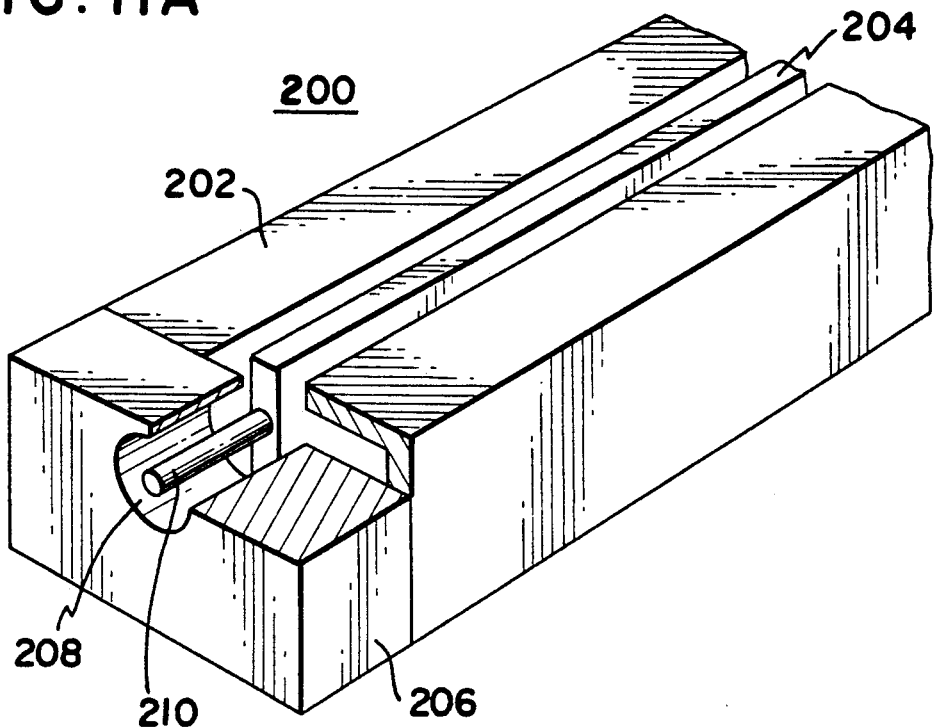
Figure 11B:
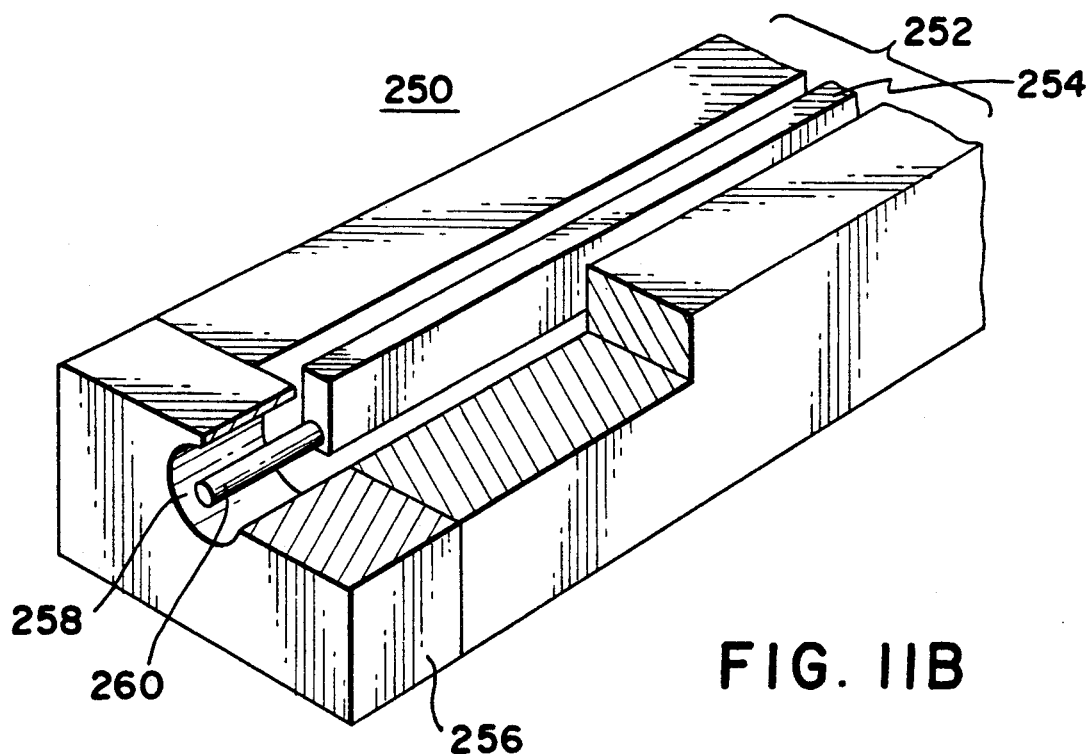

Turning now to FIGS. 11A and 11B, there are illustrated two different adaptors for interfacing a coaxial line to a waveguide. In particular, in FIG. 11A an adaptor 200 is shown which includes a short slotted waveguide section 202; a fin 204; and, a coaxial line end plate 206. End plate 206 includes a cylindrical aperture 208 having a centrally disposed conductor 210 therein which is connected to fin 204.

In FIG. 11B, an adaptor 250 is illustrated which includes a modified coplanar waveguide 252 having a fin 254. As illustrated, fin 254 is shorter in height than fin 204 of slotted waveguide 202 in FIG. 11A. As with adaptor 200, adaptor 250 includes a coaxial line end plate 256 having a cylindrical aperture 258 disposed therein with a centrally located conductor 260 that is connected to fin 254.

The present invention therefore provides waveguide adaptors in which a transmission line is formed integrally with the waveguide to simplify the construction of the adaptor and reduce its cost. Also, this construction permits the adaptor to be employed with numerous coplanar circuits an devices.

Although the invention has been disclosed in terms of preferred embodiments, it will be understood that numerous modifications could be made thereto without departing from the true spirit and scope thereof as set forth in the following claims.

What is claimed is:

1. A waveguide structure, comprising a conductive tubular waveguide having an internal longitudinal fin directly opposing a longitudinal slot, said longitudinal fin having a transverse width narrower than the transverse width of said longitudinal slot, and said longitudinal fin extending within said longitudinal slot.

2. The waveguide structure of claim 1, wherein said tubular waveguide is rectangular in transverse cross-section.

3. The waveguide structure of claim 1 wherein said longitudinal fin and said longitudinal slot combine to form a coplanar transmission line means integrally on a surface of said waveguide for transmitting electromagnetic waves along said surface of said waveguide, and said waveguide structure further includes:
impedance matching means for directing electromagnetic waves between said waveguide and said coplanar transmission line means.

4. The waveguide structure of claim 3 wherein said coplanar transmission line means operates in the odd-mode.

5. A waveguide structure for use in an adaptor for interfacing a waveguide to a coplanar transmission line comprising:
a) a conductive tubular waveguide having an axial passage disposed therein;
b) a longitudinal fin disposed internally of said waveguide in said passage; and
c) a longitudinal slot disposed in a wall of said waveguide facing said passage, sad longitudinal fin directly opposing said longitudinal slot, having a transverse width narrower than the transverse width of said longitudinal slot and extending within said longitudinal slot.

6. A waveguide structure, comprising a conductive tubular waveguide having an internal longitudinal fin directly opposing a longitudinal slot disposed in, and passing completely through, a wall of said conductive tubular waveguide, said longitudinal fin having a transverse width narrower than the transverse width of said longitudinal slot, and said longitudinal fin extending within said longitudinal slot.

7. A waveguide structure for use in an adaptor for interfacing a waveguide to a coplanar transmission line comprising:
a) a conductive tubular waveguide having an axial passage disposed therein;
b) a longitudinal fin disposed internally of said waveguide in said passage; and
c) a longitudinal slot disposed in, and extending completely through, a wall of said waveguide facing said passage, said longitudinal fin directly opposing said longitudinal slot, having a transverse width narrower than the transverse width of said longitudinal slot and extending within said longitudinal slot.

8. A waveguide structure, comprising a conductive tubular waveguide having an internal longitudinal fin directly opposing a longitudinal slot, said longitudinal slot being disposed on a wall of said waveguide and including two parallel, spaced edges.

9. The waveguide structure of claim 8, wherein said tubular waveguide is rectangular in transverse cross-section.

10. The waveguide structure of claim 8, wherein said longitudinal fin has a transverse width narrower than the transverse width of said longitudinal slot.

11. The waveguide structure of claim 10, wherein said longitudinal fin extends within said longitudinal slot.

* * * * *